(12) United States Patent
Matsumoto

(10) Patent No.: US 9,969,933 B2
(45) Date of Patent: May 15, 2018

(54) PHOSPHOR, LIGHT-EMITTING DEVICE, IMAGE DISPLAY DEVICE, AND ILLUMINATION DEVICE

(71) Applicant: Mitsubishi Chemical Corporation, Chiyoda-ku (JP)

(72) Inventor: Hajime Matsumoto, Kanagawa (JP)

(73) Assignee: MITSUBISHI CHEMICAL CORPORATION, Chiyoda-ku (JP)

(*) Notice: Subject to any disclaimer, the term of this patent is extended or adjusted under 35 U.S.C. 154(b) by 0 days. days.

(21) Appl. No.: 15/420,499

(22) Filed: Jan. 31, 2017

(65) Prior Publication Data
US 2017/0137709 A1 May 18, 2017

Related U.S. Application Data

(63) Continuation of application No. PCT/JP2015/072427, filed on Aug. 6, 2015.

(30) Foreign Application Priority Data

Aug. 7, 2014 (JP) ................................. 2014-161721

(51) Int. Cl.
*C09K 11/08* (2006.01)
*C09K 11/77* (2006.01)
*H01L 33/50* (2010.01)

(52) U.S. Cl.
CPC ...... *C09K 11/7734* (2013.01); *C09K 11/0883* (2013.01); *H01L 33/502* (2013.01)

(58) Field of Classification Search
CPC ....................................................... H01L 33/502
See application file for complete search history.

(56) References Cited

U.S. PATENT DOCUMENTS

| 7,507,354 | B2 | 3/2009 | Oshio | |
| 9,062,252 | B2 * | 6/2015 | Hirosaki | ............ C09K 11/0883 |
| 9,671,086 | B2 * | 6/2017 | Liu | ........................... F21V 9/16 |
| 2007/0007494 | A1 | 1/2007 | Hirosaki et al. | |

(Continued)

FOREIGN PATENT DOCUMENTS

| CN | 103773365 | 5/2014 |
| JP | 2005-336253 | 12/2005 |

(Continued)

OTHER PUBLICATIONS

International Search Report dated Oct. 27, 2015 in PCT/JP2015/072427, filed on Aug. 6, 2015(with English Translation).

(Continued)

*Primary Examiner* — Raj R Gupta
(74) *Attorney, Agent, or Firm* — Oblon, McClelland, Maier & Neustadt, L.L.P.

(57) ABSTRACT

The present invention relates to a phosphor represented by the Formula [1]: $M_aSr_bCa_cAl_dSi_eN_f$, wherein the phosphor includes phosphor particles in which single crystallites are three-dimensionally coupled to each other, the phosphor particles include a crystal grain boundary triple point, and [a total number of the crystal grain boundary triple points (A)]/[the number of the phosphor particles (B)] is 1.0 or less.

6 Claims, 1 Drawing Sheet

(56) References Cited

U.S. PATENT DOCUMENTS

| | | | |
|---|---|---|---|
| 2009/0059471 A1* | 3/2009 | Fukuda | H01G 4/1227 361/321.4 |
| 2009/0134775 A1 | 5/2009 | Watanabe et al. | |
| 2009/0283721 A1 | 11/2009 | Liu et al. | |
| 2010/0025632 A1* | 2/2010 | Fukuda | C04B 35/597 252/301.6 R |
| 2010/0052515 A1 | 3/2010 | Watanabe et al. | |
| 2010/0164367 A1* | 7/2010 | Shioi | C04B 35/597 313/503 |
| 2010/0187974 A1* | 7/2010 | Zhang | C04B 35/597 313/503 |
| 2010/0308712 A1 | 12/2010 | Liu et al. | |
| 2011/0204769 A1* | 8/2011 | Fukuda | C04B 35/597 313/503 |
| 2012/0025651 A1* | 2/2012 | Komuro | H01F 1/0572 310/152 |
| 2012/0075770 A1* | 3/2012 | Banno | B82Y 30/00 361/321.4 |
| 2013/0162109 A1* | 6/2013 | Hatano | H01L 41/083 310/366 |
| 2013/0168606 A1 | 7/2013 | Hirosaki et al. | |
| 2013/0207535 A1 | 8/2013 | Hirosaki et al. | |
| 2013/0207538 A1 | 8/2013 | Hirosaki et al. | |
| 2013/0214675 A1 | 8/2013 | Watanabe et al. | |
| 2013/0234585 A1* | 9/2013 | Albessard | C09K 11/7734 313/503 |
| 2013/0234586 A1 | 9/2013 | Liu et al. | |
| 2013/0234589 A1* | 9/2013 | Tao | C09K 11/0883 313/503 |
| 2013/0241387 A1* | 9/2013 | Fukuda | C09K 11/0883 313/47 |
| 2015/0179899 A1* | 6/2015 | Hirosaki | H01L 33/502 257/88 |
| 2015/0275082 A1 | 10/2015 | Hirosaki et al. | |
| 2015/0308657 A1* | 10/2015 | Liu | C09K 11/0883 362/84 |
| 2015/0315464 A1 | 11/2015 | Liu et al. | |

FOREIGN PATENT DOCUMENTS

| | | |
|---|---|---|
| JP | 2006-52337 | 2/2006 |
| JP | 2007-291352 | 11/2007 |
| JP | 2008-127509 | 6/2008 |
| JP | 2010-18771 | 1/2010 |
| JP | 2010-265447 | 11/2010 |
| JP | 2011-246662 | 12/2011 |
| JP | 2013-142134 | 7/2013 |
| JP | 2013-142135 | 7/2013 |
| JP | 2014-95055 | 5/2014 |
| WO | WO 2013/069693 A1 | 5/2013 |

OTHER PUBLICATIONS

Written Opinion dated Oct. 27, 2015 in PCT/JP2015/072427, filed on Aug. 6, 2015.

* cited by examiner

PHOSPHOR, LIGHT-EMITTING DEVICE, IMAGE DISPLAY DEVICE, AND ILLUMINATION DEVICE

TECHNICAL FIELD

The present invention relates to a phosphor, a light-emitting device, an image display device, and an illumination device.

BACKGROUND ART

Recently, along a trend of energy saving, a demand for illumination or a backlight that uses an LED is increasing. The LED that is used is a white light-emitting LED in which a phosphor is disposed on an LED chip that emits light of a wavelength of blue or near ultraviolet.

As this type of white light-emitting LED, recently, an LED, which uses a red light-emitting nitride phosphor and a green light-emitting phosphor in which blue light from a blue LED chip is set as excitation light on the blue LED chip, has been used. Particularly, as the red light-emitting nitride phosphor, a phosphor (hereinafter, may be referred to as "SCASN phosphor"), in which an augmenting agent is added to a parent body expressed as $(Sr, Ca)AlSiN_3$, and the like has been developed (PTL 1 and PTL 2).

To improve luminescent properties of the nitride phosphors, for example, PTL 3 discloses a method in which the amount of Cu is set to a constant value or less. In addition, for example, PTL 4 discloses a method in which the amount of sulfur or phosphorous is set to a constant value or less, and the like so as to control the amount to a specific composition region.

CITATION LIST

Patent Literature

[PTL 1] JP-A-2005-336253
[PTL 2] JP-A-2007-291352
[PTL 3] JP-A-2013-142134
[PTL 4] JP-A-2013-142135

SUMMARY OF INVENTION

Technical Problem

However, from examination made by the present inventors, it could be seen that luminescent properties are not sufficient in the SCASN phosphors disclosed in PTL 3 and PTL 4. From a result of repetitive examination, the present inventors have obtained the following findings with respect to the reason why the luminescent properties are not sufficient in the SCASN phosphors.

The SCASN phosphor includes polycrystalline phosphor particles in which a plurality of single crystallites are three-dimensionally coupled to each other through a grain boundary. In a case where a crystal grain boundary triple point is present in the phosphor particles, an amorphous called a pore is present in a region of the crystal grain boundary triple point.

The present inventors have found that the amorphous is a component that deviates from a composition ratio expressed by Formula [1], and when this component is contained in the phosphor, light-emission in the phosphor crystal is inhibited. That is, the present inventors have found that a ratio of crystal grain boundary triple points to SCASN phosphor particles, and luminescent properties, more specifically, internal quantum efficiency are correlated to each other.

Furthermore, the present inventors have also found that the situation is a specific phenomenon of the SCASN phosphor in which the amount of Sr is great. That is, the invention has been made in consideration of the above-described situation, and the invention provides a phosphor in which luminescent properties are high, particularly, the internal quantum efficiency is high. In addition, the invention provides a light-emitting device including the phosphor, and an image display device and an illumination device which include the light-emitting device.

Solution to Problem

The present inventors have made a thorough investigation, and have found that when a ratio of the crystal grain boundary triple points to the SCASN phosphor particles is set to a specific value or less, it is possible to solve the above-described problem. As a result, the present inventors have accomplished the invention.

That is, the gist of the invention is as follows.
1. A phosphor represented by the following Formula [1],
wherein the phosphor comprises phosphor particles in which single crystallites are three-dimensionally coupled to each other, the phosphor particles include a crystal grain boundary triple point, and
[a total number of the crystal grain boundary triple points (A)]/[the number of the phosphor particles (B)] is 1.0 or less, $$M_a Sr_b Ca_c Al_d Si_e N_f \qquad [1]$$

(In Formula [1],
M represents an activation element, and
a, b, c, d, e, and f represent values in the following ranges:
$0 < a \leq 0.15$
$0.5 \leq b < 1$
$0 < c < 0.5$
$a+b+c=1$
$0.7 \leq d \leq 1.3$
$0.7 \leq e \leq 1.3$
$2.5 \leq f \leq 3.5$).
2. The phosphor according to the item 1 above, further comprising oxygen.
3. The phosphor according to the item 1 or 2 above, having a roundness of 0.6 or greater.
4. A light-emitting device, comprising:
   a first light-emitting body; and
   a second light-emitting body that emits visible light through irradiation with light from the first light-emitting body,
wherein the second light-emitting body contains one or more kinds of the phosphors according to any one of the items 1 to 3 above as a first phosphor.
5. An image display device, comprising the light-emitting device according to the item 4 above as a light source.
6. An illumination device, comprising the light-emitting device according to the item 4 above as a light source.

Advantageous Effects of Invention

According to the invention, it is possible to provide a phosphor in which luminescent properties are satisfactory, particularly, internal quantum efficiency is high. In addition, it is possible to provide a high-quality light-emitting device including the phosphor, and high-quality image display device and illumination device which include the light-emitting device.

DESCRIPTION OF EMBODIMENTS

Figure 1A:
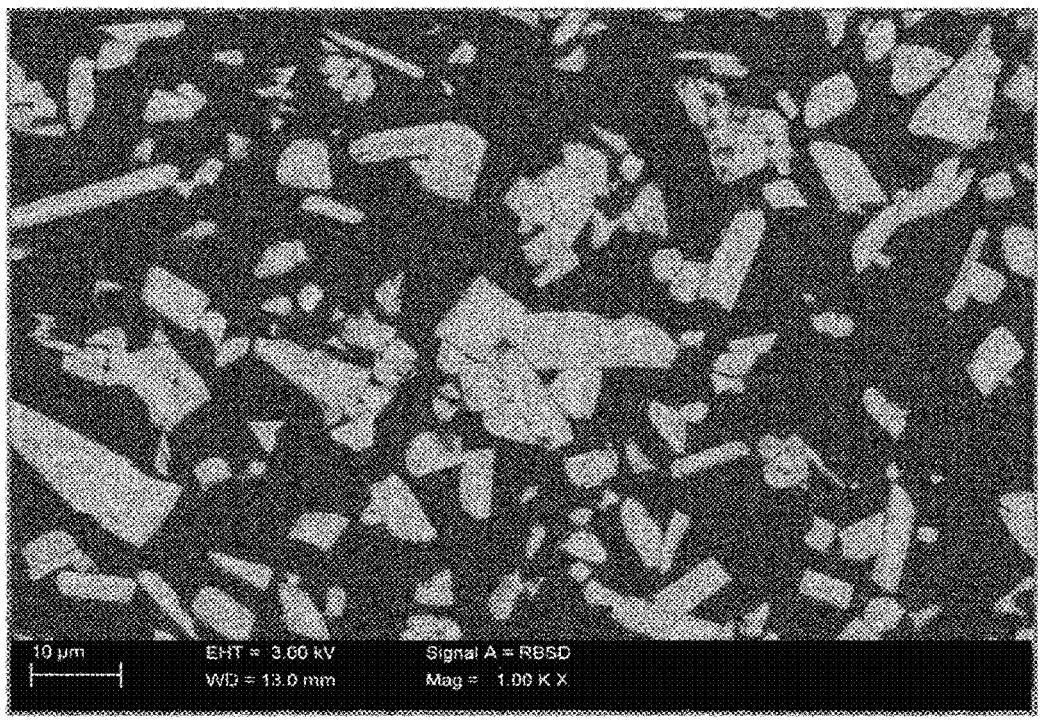
FIG. 1A is a view illustrating an original image of a SEM photograph of a phosphor that is created in Example 2 of the invention.

Embodiments of the present invention are described below in detail. It should be noted, however, that the present invention is not limited by the following embodiments, examples, and the like and may be arbitrarily implemented in various modifications in a range not departing from the gist of the invention.

<With Respect to Phosphor>
[With Respect to Formula [1]]

An SCASN phosphor of the invention is a phosphor having a crystal phase expressed by Formula [1].

$$M_a Sr_b Ca_c Al_d Si_e N_f \qquad [1]$$

In Formula [1],

M represents an activation element.

In addition, a, b, c, d, e, and f represent values in the following ranges.

0<a≤0.15
0.5≤b<1
0<c<0.5
a+b+c=1
0.7≤d≤1.3
0.7≤e≤1.3
2.5≤f≤3.5

Here, M represents an activation element. It is preferable europium (Eu), manganese (Mn), cerium (Ce), praseodymium (Pr), neodymium (Nd), samarium (Sm), terbium (Tb), dysprosium (Dy), holmium (Ho), erbium (Er), thulium (Tm), and ytterbium (Yb) are contained as the activation element, and more preferably at least Eu.

In addition, in addition to Eu, at least one kind of element selected from the group consisting of Ce, Pr, Sm, Tb, and Yb may be contained, and Ce is more preferable from the viewpoint of light-emitting quantum efficiency. That is, it is more preferable that M is Eu and/or Ce, still more preferably, Eu and/or Eu and Ce. A ratio of europium (Eu) to the entirety of the activation element is preferably 50 mol % or greater, more preferably 70 mol % or greater, and still more preferably 90 mol % or greater.

In Formula [1], "Sr" represents strontium element, and "Ca" represents a calcium element. Sr and Ca may be partially substituted with an element in which other chemical properties are similar, for example, barium (Ba), magnesium (Mg), and the like. Among the elements, for example, Ba may be unavoidably mixed-in in a raw material, or may be mixed-in in a slight amount in a case where a flux is used to prepare the phosphor. The invention is not intended to exclude these cases.

In Formula [1], [Al] represents an aluminum element. Al may be partially substituted with an element in which other chemical properties are similar, for example, boron (B), gallium (Ga), and the like. In Formula [1], "Si" represents silicon. Si may be partially substituted with an element in which other chemical properties are similar, for example, germanium (Ge) and the like.

In Formula [1], "N" represents nitrogen. N may partially include other elements such as oxygen (O) or a halogen element (for example, fluorine (F), chlorine (Cl), bromine (Br), or iodine (I)). Furthermore, "containing of an element" in the invention represents both an aspect in which an element is substituted, and an aspect in which an element is contained without substitution.

Consideration may be made to a case where oxygen is mixed in as an impurity in a raw material metal, and a case where oxygen is introduced during a manufacturing process such as a pulverizing process and a nitriding process. In the SCASN phosphor of the invention, oxygen is unavoidably mixed in.

Furthermore, the amount of oxygen contained in the phosphor is typically 10% by mass or less in a range in which deterioration in the luminescent properties of the phosphor is acceptable, preferably 6% by mass or less, still more preferably 4% by mass or less, and still more preferably 2% by mass or less.

As is the case with oxygen, a halogen element may also be contained in the phosphor of the invention. Consideration may be made to a case where the halogen element is contained in the phosphor, a case where the halogen element is mixed in as an impurity in a raw material metal, a case where the halogen element is introduced during a manufacturing process such as a pulverizing process and a nitriding process, and the like. Particularly, in a case where a halide is used as a flux, the halogen element may be contained in the phosphor.

As described above, examples of the halogen element that is mixed-in includes a fluorine element, a chlorine element, a bromine element, an iodine element, and the like. From the viewpoint that the luminescent properties of the phosphor are acceptable, the amount of halogen element is preferably 1% by mass or less, and more preferably 0.5% by mass or less.

With respect to a+b+c, d, e, and f in Formula [1], it is preferable to set an atomic molar ratio thereof from the following viewpoint. An atomic molar ratio (a+b+c:d:e:f) in Formula [1] is preferably 1:1:1:3 as a stoichiometry. Actually, excess and deficiency occur due to deficiency due to a binary metal or oxygen, charge compensation, and the like.

An acceptable range of the excess and deficiency is typically 30%, preferably 20%, more preferably 10% or greater, and still more preferably approximately 10%. The acceptable ranges may be arbitrarily set as long as use as a phosphor is possible, and the same crystal structure as the SCASN phosphor is provided. Furthermore, whether or not the same crystal structure as the SCASN phosphor is provided can be confirmed by checking whether or not an XRD peak is substantially the same as an XRD peak of SCASN described in a JCPDS card.

A range of a is 0<a≤0.15, and the lower limit thereof is preferably 0.00001, more preferably 0.001, and still more preferably 0.005. The upper limit thereof is preferably 0.1, more preferably 0.05, and still more preferably 0.01.

A range of b is 0.5≤b<1, and the lower limit thereof is preferably 0.6, more preferably 0.7, still more preferably 0.8, and still more preferably 0.85. In addition, the upper limit thereof is preferably 0.99999.

A range of c is 0<c<0.5, and the upper limit thereof is preferably 0.4, more preferably 0.3, still more preferably 0.2, and still more preferably 0.15.

A mutual relationship of a, b, and c satisfies a+b+c=1.

A range of d is 0.7≤d≤1.3, and the lower limit thereof is preferably 0.8, and more preferably 0.9. In addition, the upper limit thereof is preferably 1.2, and more preferably 1.1.

A range of e is 0.7≤e≤1.3, and the lower limit thereof is preferably 0.8, and more preferably 0.9. In addition, the upper limit thereof is preferably 1.2, and more preferably 1.1.

A range of f is 2.5≤f≤3.5, and the lower limit thereof is preferably 2.6, and more preferably 2.8. In addition, the upper limit thereof is preferably 3.3, and more preferably 3.1.

<Total Number of Crystal Grain Boundary Triple Points (A)/Number of Phosphor Particles (B)>

In the phosphor of the invention, (A)/(B) obtained through measurement described in the following column of [Method of Measuring Value of Total Number of Crystal Grain Boundary Triple Points (A)/Number of Phosphor Particles (B)] is 1.0 or less, preferably 0.8 or less, more preferably 0.6 or less, and still more preferably 0.5 or less. When (A)/(B) is in the above-described range, it is easy to obtain the SCASN phosphor excellent in internal quantum efficiency, and thus this range is preferable.

Description of Terminology

Description will be given of the "crystal grain boundary triple points" and the "phosphor particles" in the invention with reference to FIG. 1B. Furthermore, FIG. 1B illustrates a contrast image that is obtained through segmentation of an image obtained by implementing an scanning electron microscopy technique (SEM technique) with respect to a phosphor obtained in the following Example 2 by using image processing software ImageJ.

Figure 1B:
FIG. 1B is a view obtained through segmentation of the original image.

In FIG. 1B, the phosphor particles are indicated by a black image, and the crystal grain boundary triple points are indicated by a white point (spot) surrounded by black. The "surrounded by black" represents that the spot is an independent white point that is not connected to background white.

Furthermore, the SCASN phosphor particles are polycrystals in which a plurality of single crystallites are three-dimensionally coupled to each other through a grain boundary. Accordingly, in a two-dimensional image measured by the SEM technique, even when only one phosphor particle is confirmed, it can be said that the phosphor particles are three-dimensionally coupled.

[Method of Measuring Value of Total Number of Crystal Grain Boundary Triple Points (A)/Number of Phosphor Particles (B)]

The total number of the crystal grain boundary triple points (A), and the number of phosphor particles (B) in the invention are measured by a method of observing a secondary particle cross-section of the phosphor particles with a transmission electron microscopy technique (TEM technique), a scanning electron microscopy technique (SEM technique), and the like.

In the methods, it is preferable to observe a measurement sample, which is obtained by embedding a phosphor in a resin and by processing a cross-section of the phosphor, with the SEM technique. Furthermore, in the measurement, a visual ranges is set so that the number of the phosphor particles (B) is typically 50 or greater. The number of the phosphor particles is preferably 100 or greater, and more preferably 200 or greater.

In a case of performing measurement with the SEM technique, an arbitrary detector may be used. Examples of the detector include a secondary electron detector, a reflection detector, a cathode luminescence detector, and the like. Furthermore, in the invention, it is preferable to perform the measurement by using Ultra 55 (manufactured by Carl Zeiss Co., Ltd.) as the scanning electron microscope, and a backscattered-electron detector Centaurus (manufactured by Carl Zeiss Co., Ltd.) as the detector.

In a case of using the SEM and the backscattered-electron detector, there is no particular limitation to measurement conditions except that the number of the phosphor particles is set. For example, an acceleration voltage is typically 3 to 5 kV, and preferably 3 kV. In addition, it is necessary to set an observation magnification so that the number of phosphor particles is 50 or greater, and the crystal grain boundary triple points can be measured. Accordingly, preferably, measurement is performed in a magnification of 500 times to 1000 times.

Furthermore, values of the total number of the crystal grain boundary triple points (A) and the number of the phosphor particles (B) are counted through contrast measurement by using an image measured by the SEM technique, for example, by using image processing software ImageJ, and the like.

The reason why the contrast measurement is possible is as follows. In a case where the crystal grain boundary triple points exist, an amorphous phase is included in the region, and reflection intensity of the crystal grain boundary triple points is different from that of the SCASN phosphor particles. According to this, measurement with a contrast is possible.

In a case where the contrast measurement is performed by using the image processing software ImageJ, setting is made to a contrast for segmentation of the crystal grain boundary triple points and the phosphor particles for conversion into an image in which the crystal grain boundary triple points are shown in a spot shape. Then, the number of the spots is automatically counted by using the same software. With regard to the number of the phosphor particles, the image, which is used to measure the crystal grain boundary triple points, is subjected to white-to-black inversion, and automatic counting is performed in the same manner. From results which are obtained, a number ratio is calculated. Furthermore, there is no limitation to the above-described method as long as the total number of the crystal grain boundary triple points and the number of the phosphor particles can be counted.

[With Respect to Roundness]

In the phosphor of the invention, a roundness measured in the following [Method of Measuring Roundness] is preferably 0.60 or greater, more preferably 0.62 or greater, and still more preferably 0.63 or greater. When the roundness is in the above-described range, it is easy to obtain the SCASN phosphor excellent in the luminescent properties, for example, the internal quantum efficiency, and thus this range is preferable.

[Method of Measuring Roundness]

The roundness in the invention can be measured in the same manner as in the scanning electron microscopy technique (SEM technique) described in the column of [Method of Measuring Value of Total Number of Crystal Grain Boundary Triple Points (A)/Number of Phosphor Particles (B)]. More specifically, it is possible to derive an image measured by the SEM technique by using the image processing software ImageJ, and the like.

In a case of performing the roundness measurement by using the image processing software ImageJ, the phosphor particles and the background are set to a contrast for segmentation into white and black for conversion into an image in which a particle contour is highlighted. This may be the same as in the image processing described in the column of the [Method of Measuring Value of Total Number of Crystal Grain Boundary Triple Points (A)/Number of Secondary Particles (B)]. Then, roundness obtained through particle analysis by the same image processing software is obtained through automatic counting for individual particle.

Furthermore, in "a value obtained by dividing a longitudinal length with a horizontal length" and "a value obtained by dividing the horizontal length with the longitudinal length", the minimum value is employed as a value of the roundness. There is no limitation to the above-described method as long as the value can be counted.

<With Respect to Physical Properties of Phosphor>

[Luminescent Color]

A luminescent color of the phosphor in the invention can be set to a desired luminescent color such as blue, blue-green, green, yellow-green, yellow, orange, and red through excitation with light with a wavelength of 360 nm to 480 nm in an ultraviolet region to a blue region by adjusting a chemical composition and the like.

[Emission Spectrum]

An emission peak wavelength and a shape thereof are different depending on a chemical composition of the phosphor or the kind of an activation element. However, for example, in a case where the phosphor of the invention is a phosphor that contains a large amount of Sr, and contains Eu as the activation element M, when measuring an emission spectrum in a case of excitation with light having a peak wavelength of 455 nm in consideration of a use as an orange phosphor to a red phosphor, it is preferable to have the following characteristics.

First, in the phosphor, it is preferable that a peak wavelength $\lambda p$ (nm) in the above-described emission spectrum is typically greater than 590 nm, preferably 600 nm to 650 nm, and more preferably a range of 640 nm or less. When the peak wavelength $\lambda p$ (nm) is in the above-described range, luminescent properties as orange to red are satisfactory, and thus this range is preferable.

In addition, in the phosphor, full width at half maximum (hereinafter, appropriately abbreviated as "FWHM") of an emission peak in the above-described emission spectrum is typically greater than 50 nm, preferably 70 nm or greater, and more preferably 75 nm or greater. In addition the FWHM is typically less than 120 nm, preferably less than 100 nm, and more preferably less than 90 nm. When the FWHM is in the above-described range, in a case the phosphor is applied to a light-emitting device, both color rendering properties and luminescent efficiency of the light-emitting device are satisfactory, and thus this range is preferable.

Furthermore, for example, a GaN-based light-emitting diode can be used to excite the phosphor with light having a peak wavelength of 455 nm. In addition, measurement of the emission spectrum of the phosphor of the invention can be performed, for example, by using a 150 W xenon lamp as an excitation light source, a fluorescence measuring device (manufactured by JASCO Corporation) provided with a multi-channel CCD detector C7041 (manufactured by Hamamatsu Photonics K.K.) as a spectrum measuring device, and the like. The emission peak wavelength and the full width at half maximum of the emission peak can be calculated from an emission spectrum that is obtained.

[Internal Quantum Efficiency]

In the phosphor of the invention, it is preferable that the internal quantum efficiency is as high as possible. The value is typically 0.86 or greater, preferably 0.88 or greater, more preferably 0.9 or greater, and still more preferably 0.913 or greater. In the above-described range, the luminescent efficiency is high, and thus this range is preferable.

<With Respect to Method of Manufacturing Phosphor>

Examples of the method of manufacturing the phosphor of the invention include a manufacturing method (alloying method) that uses an alloy for a phosphor raw material, a manufacturing method (nitride method) that uses a raw material nitride, and the like.

As the manufacturing method that uses the alloy for the phosphor raw material, for example, it is possible to manufacture the phosphor in accordance with description in JP-A-2009-132916, WO2006/106948, and the like. In addition, examples of the manufacturing method that uses the raw material nitride include a method that is described in WO2005/052087, and the like. In any method, in a process of baking a raw material, 1) occurrence of single crystallites, 2) formation of secondary particles through aggregation of the single crystallites, and 3) crystal grain growth of the secondary particles are included.

Here, examples of technical idea of the manufacturing method of obtaining the phosphor of the invention includes a technical spirit of reducing the number of the single crystallites included in the vicinity of the secondary particles, a technical spirit of decomposing amorphous included in crystal grain boundary triple points and of allowing further crystal grain growth to occur by using the decomposed amorphous as a raw material supply source, and the like.

Furthermore, the amorphous included in the crystal grain boundary triple points in the invention is present at the inside of the phosphor, and thus it is very difficult to remove the amorphous with a washing process and the like. Examples of a method of reducing the signal crystallite included in the vicinity of the secondary particles include a method of reducing the number of single crystallites which are generated, and a method of shortening time taken until the single crystallites are aggregated and the secondary particles are formed.

For example, in a case of the nitride method, examples of the method of reducing the single crystallites contained in the vicinity of the secondary particles include a method of lowering a temperature raising rate until reaching a temperature at which single crystallites are generated or of allowing growth to occur at the lowest temperature in a crystal growth temperature range, and the like. In addition, for example, in a case of the alloying method, examples of the method of shortening time taken until single crystallites are aggregated include a method in which temperature-raising and pressure-raising are performed at once to a crystal growth temperature of the secondary particles after generation of the single crystallites, and the like.

In any case, the phosphor of the invention can be obtained by appropriately setting a temperature, a pressure, temperature-raising time, or baking retention time, and the like in the following ranges on the basis of the technical idea of the manufacturing method.

Hereinafter, respective cases will be described in detail, but the invention is not limited thereto.

[Alloying Method]

In a case of manufacturing the phosphor of the invention with the alloying method, for example, when manufacturing a phosphor having a composition expressed by Formula [1], a metal or an alloy (hereinafter, may be simply referred to as "raw material metal) is weighed to obtain a composition of the following Formula [2]. Then, the raw material metal is melted and alloyed to prepare an alloy for a phosphor raw material, and the alloy for the phosphor raw material is pulverized to prepare an alloy powder. The alloy powder is heated in a nitrogen-containing atmosphere for nitriding.

Hereinafter, although more detailed description will be given later, when melting the raw material metals, it is preferable that an alloy containing Si metal and/or Si having a high melting point (high boiling point) is melted, and Ca and Sr having a low melting point (low boiling point) are melted as to be described later.

   [2]

(provided that, M, a, b, c, d, and e are the same as in Formula [1].)

(Shape of Raw Material Metal)

There is no limitation to a shape of the raw material metal. However, typically, a raw material, which has a powder shape or a bulk shape in which a diameter is several mm to several tens of mm, is used.

In a case where the phosphor of the invention contains Sr, Sr is chemically active, and thus it is preferable to use a bulk-shaped raw material.

(Melting of Raw Material Metal)

The raw material metal is weighed to a desired composition, and is melted. There is no particular limitation to a method of melting the raw material metal, and a known method is used. In addition, with regard to melting of the raw material metal, it is preferable that an alloy containing Si metal and/or Si having a high melting point (high boiling point) is melted, and then an alkaline-earth metal (Sr or Ca) having a low melting point (low boiling point) is melted. In the invention, there is no particular limitation to the method of melting the raw material metal, and examples thereof typically include a resistive heating method, an electron beam method, an arc melting method, a high-frequency induction heating method, and the like.

(Casting of Molten Metal)

A nitrogen-containing alloy can be directly manufactured from an alloy molten metal prepared through melting of the raw material metal, but it is preferable to obtain a solidified body (alloy ingot) through a casting process of injecting the alloy molten metal prepared through the melting of the raw material metal into a mold.

(Pulverization of Ingot)

The alloy ingot obtained in the casting process is subsequently pulverized to prepare an alloy powder having a particle size and a particle size distribution which are desired. Examples of a pulverization method include a dry method and a wet method using an organic solvent such as ethylene glycol, hexane, and acetone.

(Classification of Alloy Powder)

The alloy powder, which is pulverized in the pulverization process, adjusted to a mass median diameter $D_{50}$ and a particle size distribution which are desired by using a sieving device such as a vibrating screen and a shifter which use a mesh, an inertial classification device such as an air separator, or a centrifugal separator such as a cyclone.

It is necessary to adjust a particle size of an alloy powder before the following primary nitriding process in according with activity of metal elements which constitute the alloy powder. Typically, mass median diameter $D_{50}$ is 100 μm or less, and preferably 80 μm or less. In addition, the mass median diameter $D_{50}$ is 0.1 μm or greater, and preferably 0.5 μm or greater.

(Manufacturing of Phosphor)

The alloy powder is subjected to a nitriding reaction. In a nitriding treatment of the alloy powder, first, a crucible or a tray is filled with the alloy powder. Examples of a material of the crucible or the tray, which is used here, include boron nitride, silicon nitride, aluminum nitride, molybdenum, tungsten, and the like.

The crucible or the tray, which is filled with the alloy powder, is accommodated in a heating furnace of which an atmosphere can be controlled, and then a nitrogen-containing gas is allowed to circulate through the heating furnace to substitute an inside system with the nitrogen-containing gas. The nitrogen-containing gas may be allowed to circulate after evacuating the inside system as necessary. Examples of the nitrogen-containing gas that is used in the nitriding treatment include nitrogen-containing gas such as nitrogen, ammonia, a mixed gas of nitrogen and hydrogen, and the like.

The nitriding treatment is performed through heating in a state in which the nitrogen-containing gas is filled or is allowed to circulate, the pressure at this time may be any one of a state of being slightly reduced in comparison to the atmospheric pressure, a state of the atmospheric pressure, and a state of being pressurized. It is preferable that the pressure is set to a pressure equal to or higher than the atmospheric pressure so as to prevent mixing-in of oxygen in the air.

When the pressure is set to be equal to or higher than the atmospheric pressure, it is possible to prevent characteristics of the phosphor that is obtained from deteriorating due to mixing-in of a large amount of oxygen when hermetic closing properties of the heating furnace are poor. It is preferable that the pressure of the nitrogen-containing gas is at least 30 MPa or greater in terms of a gauge pressure, and more preferably 60 MPa to 120 MPa.

Heating of the alloy powder is typically performed at a temperature of 800° C. or higher, preferably 1200° C. or higher, and more preferably 1500° C. or higher. In addition, the heating is typically performed at a temperature of 2200° C. or lower, preferably 2100° C. or lower, and more preferably 2000° C. or lower. When the heating temperature is set to 800° C. or higher, it is possible to prevent time necessary for the nitriding treatment from being lengthened. On the other hand, when the heating temperature is set to 2200° C. or lower, a nitride, which is generated, is prevented from being volatized or decomposed, and thus it is easy to obtain a phosphor having a desired composition.

Heating time (retention time at the highest temperature) in the nitriding treatment may be time necessary for a reaction between the alloy powder and nitrogen. Typically, the heating time is 1 minute or longer, preferably 10 minutes or longer, more preferably 30 minutes or longer, and still more preferably 60 minutes or longer. When the heating time is set to 1 minute or longer, a nitriding reaction proceeds sufficiently, and thus it is easy to obtain a phosphor in which characteristics are high. Typically, the upper limit of the heating time is preferably 24 hours or shorter from the viewpoint of production efficiency.

After the nitriding treatment of the alloy, it is preferable to subject the phosphor that is obtained to pulverization, and a classification treatment. For example, it is preferable to perform the pulverization and the classification treatment so that 90% or greater of the phosphor particles which are obtained are composed of particles having a particle size of 5 μm to 20 μm. Furthermore, after the nitriding treatment, a post-treatment process such as washing process and a drying process may be included.

[Nitride Method]

In a case of manufacturing the phosphor of the invention with the nitride method, the phosphor is manufactured by mixing respective phosphor raw materials with each other, and by baking a resultant phosphor raw material mixture that is obtained. Particularly, so as to obtain the phosphor of the invention, conditions may be appropriately set on the basis of technical idea in manufacturing methods in which processes are classified into a process of allowing a crystal nucleus to occur, and a process of growing a crystal. The methods may be used alone or in combination of a plurality of the methods.

Hereinafter, the manufacturing method in the invention will be described in detail, but the phosphor of the invention can be obtained through appropriate adjustment on the basis of the above description.

Examples of the phosphor raw material include a metal compound, a metal, and the like. For example, in a case of manufacturing a phosphor having a crystal phase composition expressed by Formula [1], raw materials in a necessary combination selected from an Sr element raw material (hereinafter, appropriately referred to as "Sr source"), a Ca element raw material (hereinafter, appropriately referred to as "Ca source"), an Al element raw material (hereinafter, appropriately referred to as "Al source"), an Si element raw material (hereinafter, appropriately referred to as "Si source"), an N element raw material (hereinafter, appropriately referred to as "N source"), and an M element raw material (hereinafter, appropriately referred to as "M source") are mixed with each other (mixing process), the resultant mixture that is obtained is baked (baking process), and the resultant baked object that is obtained is cracked and pulverized, or washed (post-treatment process) as necessary, thereby manufacturing the phosphor.

(Phosphor Raw Material)

As a phosphor raw material that is used, a known raw material can be used. In the M source, specific example of an Eu source include $Eu_2O_3$, $Eu_2(SO_4)_3$, $Eu_2(C_2O_4)_3 \cdot 10H_2O$, $EuF_2$, $EuF_3$, $EuCl_2$, $EuCl_3$, $Eu(NO_3)_3 \cdot 6H_2O$, EuN, EuNH, and the like. Among these, a nitride, an oxide, or a halide is preferable, and EuN is more preferable. In addition, the purity of the Eu source that is used is preferably as high as possible. Typically, the purity is 98% or greater, and preferably 99% or greater.

In addition, specific examples of raw materials of activation elements other than Mn, Ce, Pr, Nd, Sm, Tb, Dy, Ho, Er, Tm, Yb, and the like include compounds obtained by substituting Eu in the respective compounds exemplified as the Eu source with Mn, Ce, Pr, Nd, Sm, Tb, Dy, Ho, Er, Tm, and Yb, respectively.

Specific examples of the Sr source include SrO, $Sr(OH)_2 \cdot 8H_2O$, $SrCO_3$, $Sr(NO_3)_2$, $SrSO_4$, $Sr(C_2O_4) \cdot H_2O$, $Sr(OCOCH_3)_2 \cdot 0.5H_2O$, $SrF_2$, $SrCl_2$, $Sr_3N_2$, $Sr_3N_4$, SrNH, and the like. Among these, SrO, $SrCO_3$, $Sr_2N$, and $Sr_3N_2$ are preferable, and $Sr_2N$ and $Sr_3N_2$ are more preferable.

Specific examples of the Ca source include CaO, $Ca(OH)_2$, $CaCO_3$, $Ca(NO_3)_2 \cdot 4H_2O$, $CaSO_4 \cdot 2H_2O$, $Ca(C_2O_4)$—$H_2O$, $Ca(OCOCH_3)_2 \cdot H_2O$, $CaF_2$, $CaCl_2$, $Ca_3N_2$, CaNH, and the like. Among these, CaO, $CaCO_3$, $Ca_2N$, and $Ca_3N_2$ are preferable.

As specific examples of the Al source, it is preferable to use AlN. As specific examples of the Si source, it is preferable to use $SiO_2$ or $Si_3N_4$. In addition, it is possible to use a compound that becomes $SiO_2$ during a reaction. Specific examples of this compound include $SiO_2$, $H_4SiO_4$, $Si(OCOCH_3)_4$, and the like.

(Mixing Process)

Phosphor raw materials are weighed to obtain a target composition, and are sufficiently mixed by using a ball mill and the like, thereby obtaining a phosphor raw material mixture (mixing process). As a mixing method, a known method can be used without particular limitation.

(Baking Process)

Continuously, the phosphor raw material mixture, which is obtained in the mixing process, is baked (baking process). The phosphor raw material mixture is dried as necessary, a vessel such as a crucible is filled with the phosphor raw material mixture, baking is performed by using a baking furnace, a pressurized furnace, and the like. A baking temperature is different depending on other conditions such as a pressure, and the baking is typically performed in a temperature range of 1400° C. to 1800° C. The highest arrival temperature in the baking process is typically 1400° C. or higher, and preferably 1500° C. or higher. In addition, the highest arrival temperature is typically 1800° C. or lower, preferably 1700° C. or lower, and more preferably 1600° C. or lower.

A pressure during the baking is different depending on the baking temperature and the like. The pressure is typically 0.2 MPa or higher, and preferably 0.4 MPa or higher. In addition, the pressure is typically 10 MPa or lower, preferably 5 MPa or lower, and more preferably 2 MPa or lower. A temperature-raising rate is typically 2° C./minute or greater, and preferably 5° C./minute or greater. In addition, the temperature-raising rate is typically 30° C./minute or less, and preferably 25° C./minute or less.

Furthermore, a baking atmosphere is arbitrarily set, but a nitrogen-containing atmosphere is preferable as long as the phosphor of the invention is obtained. In addition, it is preferable that the baking atmosphere is set to an atmosphere that contains an alkali-earth metal element, for example, strontium so as to obtain the phosphor of the invention. Baking time is also different depending on the temperature, the pressure, and the like during the baking. The baking time is typically, 10 minutes or longer, and preferably 30 minutes or longer. In addition, the baking time is typically 72 hours or shorter, and preferably 12 hours or shorter. Furthermore, in the invention, it is preferable to manufacture the phosphor under relaxed conditions such as a condition in which the temperature-raising rate is lowered, the highest arrival temperature is lowered, and the baking time is lengthened.

(Post-Treatment Process)

The baked object, which is obtained as described above, may be subjected to a post-treatment process such as a classification process, a washing process, and a drying process.

<Phosphor-Containing Composition>

The phosphor of the invention may be used in a state of being mixed with a liquid medium. Particularly, in a case of using the phosphor of the invention for a use such as a light-emitting device, it is preferable to use the phosphor in a state of being dispersed in a liquid medium. A material obtained by dispersing the phosphor of the invention in a liquid medium is appropriately referred to as "phosphor-containing composition of the invention".

[Phosphor]

The kind of the phosphor of the invention, which is contained in the phosphor-containing composition of the invention, can be arbitrarily selected from the above-described kinds without limitation. In addition, the phosphor of the invention, which is contained in the phosphor-containing composition of the invention, may be used alone, or two or more kinds thereof may be used in an arbitrary combination and in an arbitrary ratio. In addition, the phosphor-containing composition of the invention may contain a phosphor other than the phosphor of the invention as long as the effect of the invention is not significantly inhibited.

[Liquid Medium]

The liquid medium, which is used in the phosphor-containing composition of the invention, is not particularly limited as long as the performance of the phosphor is not inhibited in a target range. For example, an arbitrary inorganic-based material and/or an arbitrary organic-based material may be used as long as liquid properties are exhibited under desired use conditions, the phosphor of the invention is appropriately dispersed, and a not-preferred reaction does not occur. Examples of the liquid medium include a silicone resin, an epoxy resin, a polyimide silicone resin, and the like.

[Content Rate of Liquid Medium and Phosphor]

The content rate of the phosphor and the liquid medium in the phosphor-containing composition of the invention is arbitrarily set as long as the effect of the invention is not significantly inhibited. The content rate of the liquid medium is typically 50% by mass or greater with respect to the entirety of the phosphor-containing composition of the invention, preferably 75% by mass or greater. The content rate is typically 99% by mass or less, and preferably 95% by mass or less.

[Other Components]

Furthermore, the phosphor-containing composition of the invention may contain components other than the phosphor and the liquid medium as long as the effect of the invention is not significantly inhibited. In addition, the other components may be used alone, or two or more kinds thereof may be used in an arbitrary combination and in an arbitrary ratio.

<Light-Emitting Device>

A light-emitting device of the invention (hereinafter, appropriately referred to as "light-emitting device") is a light-emitting device including a first light-emitting body (excitation light source), and a second light-emitting body that emits visible light through irradiation with light from the first light-emitting body. The second light-emitting body contains one or more kinds of the phosphors of the invention as the first phosphor. Here, the phosphor of the invention may be used alone, or two or more kinds thereof may be used in an arbitrary combination and in an arbitrary ratio.

As the phosphor of the invention, for example, a phosphor, which emits fluorescence in a region of yellow to red under irradiation with light from the excitation light source, is used. Specifically, in a case of constituting the light-emitting device, it is preferable that a yellow phosphor of the invention has an emission peak in a wavelength range of 550 nm to 600 nm, and orange to red phosphors of the invention have an emission peak in a wavelength range of 600 nm to 680 nm. Furthermore, as the excitation light source, an excitation light source having an emission peak in a wavelength range of less than 420 nm may be used.

Hereinafter, description will be given an aspect of the light-emitting device in a case where a phosphor having an emission peak in a wavelength range of 600 to 680 nm is used as the phosphor of the invention, and a light-emitting body having an emission peak in a wavelength range of 420 nm to 500 nm is used as the first light-emitting body, but the invention is not limited thereto.

In the above-described case, for example, the light-emitting device of the invention may employ the following aspect (A) or (B).

(A) An aspect in which a light-emitting body having an emission peak in a wavelength range of 420 nm to 500 nm is used as the first light-emitting body, at least one kind of phosphor (yellow phosphor) having an emission peak in a wavelength range of 560 nm or greater and less than 600 nm is used as a second phosphor of the second light-emitting body, and the phosphor of the invention is used as the first phosphor.

(B) An aspect in which a light-emitting body having an emission peak in a wavelength range of 420 nm to 500 nm is used as the first light-emitting body, at least one kind of phosphor (green phosphor) having an emission peak in a wavelength range of 500 nm or greater and less than 560 nm is used as the second phosphor of the second light-emitting body, and the phosphor of the invention is used as the first phosphor.

(Yellow Phosphor)

As the yellow phosphor in the aspect (A), for example, the following phosphor is preferable.

Examples of a garnet-based phosphor include (Y, Gd, Lu, Tb, La)$_3$(Al, Ga)$_5$O$_{12}$:(Ce, Eu, Nd). Examples of orthosilicate include (Ba, Sr, Ca, Mg)$_2$SiO$_4$:(Eu, Ce).

Examples of an (oxy)nitride phosphor include (Ba, Ca, Mg)Si$_2$O$_2$N$_2$:Eu(SION-based phosphor), (Li, Ca)$_2$(Si, Al)$_{12}$(O, N)$_{16}$:(Ce, Eu)(α-sialon phosphor), (Ca, Sr)AlSi$_4$(O, N)$_7$:(Ce, Eu)(1147 phosphor), and the like.

Furthermore, as the phosphor, the garnet-based phosphor is preferable, and a YAG-based phosphor expressed by Y$_3$Al$_5$O$_{12}$:Ce is more preferable.

(Green Phosphor)

As the green phosphor in the aspect (B), for example, the following phosphor is preferable.

Examples of a garnet-based phosphor include (Y, Gd, Lu, Tb, La)$_3$(Al, Ga)$_5$O$_{12}$:(Ce, Eu, Nd), and Ca$_3$(Sc, Mg)$_2$Si$_3$O$_{12}$:(Ce, Eu)(CSMS). Examples of a silicate-based phosphor include (Ba, Sr, Ca, Mg)$_3$SiO$_{10}$:(Eu, Ce), and (Ba, Sr, Ca, Mg)$_2$SiO$_4$:(Ce, Eu)(BSS phosphor).

Examples of an oxide phosphor include (Ca, Sr, Ba, Mg)(Sc, Zn)$_2$O$_4$:(Ce, Eu)(CASO phosphor). Examples of an (oxy)nitride phosphor include (Ba, Sr, Ca, Mg)Si$_2$O$_2$N$_2$:(Eu, Ce), Si$_{6-z}$Al$_z$O$_z$N$_{8-z}$:(Eu, Ce)(β-sialon phosphor), and (Ba, Sr, Ca, Mg, La)$_3$(Si, Al)$_6$O$_{12}$N$_2$:(Eu, Ce)(BSON phosphor). Examples of an aluminate phosphor include (Ba, Sr, Ca, Mg)$_2$Al$_{10}$O$_{17}$:(Eu, Mn)(GBAM-based phosphor).

[Configuration of Light-Emitting Device]

A configuration of the light-emitting device of the invention is not limited except that the first light-emitting body (excitation light source) is provided, and at least the phosphor of the invention is used as the second light-emitting body, and it is possible to arbitrarily employ a known device configuration. Examples of the device configuration and an embodiment of the light-emitting device include a device configuration and a light-emitting device which are described in JP-A-2007-291352. The other examples of the aspect of the light-emitting device include a cannon ball type, a cup type, a chip-on-board, a remote phosphor, and the like.

<Use of Light-Emitting Device>

The use of the light-emitting device of the invention is not particularly limited, and can be used in various fields in which a typical light-emitting device is used. Among these fields, particularly, the light-emitting device is preferably used as a light source of an illumination device or an image display device when considering that a color reproducing range is wide and color rendering properties are high.

[Illumination Device]

In a case where the light-emitting device of the invention is applied to the illumination device, the above-described light-emitting device can be used in a known illumination device in an appropriate combination. For example, a plane-emission illumination device, in which a plurality of the light-emitting devices are arranged on the bottom surface of a holding case, and the like may be exemplified.

[Image Display Device]

In a case where the light-emitting device of the invention is used as a light source of the image display device, there is no particular limitation to a specific configuration of the image display device, but it is preferable to use the light-emitting device in combination with a color filter. For example, in a case where a color image display device using a color liquid crystal display element is set as the image display device, the image display device can be obtained by setting the light-emitting device as a backlight, and by combining an optical shutter using a liquid crystal and a color filter including red pixels, green pixels, and blue pixels with each other.

EXAMPLES

Hereinafter, the invention will be described in more detail with reference to examples, but the invention is not limited to the following examples in a range not departing from the gist of the invention.

<Measurement Method>

[Measurement of Chromaticity]

An emission spectrum was measured at room temperature (25° C.) by using a 150 W xenon lamp as an excitation light source, and a fluorescence measuring device FP6500 (manufactured by JASCO Corporation) provided with a multi-channel CCD detector C7041 (manufactured by Hamamatsu Photonics K.K.) as a spectrum measuring device.

From data of a wavelength region of 480 nm to 780 nm of the emission spectrum obtained by the above-described method, chromaticity coordinates of an x, y color system (CIE 1931 color system) were calculated as chromaticity coordinates x and y in an XYZ color system defined in JIS Z8701 (1999) in accordance with a method conforming to JIS Z8724 (1997).

[Measurement of Internal Quantum Efficiency]

A sample, in which a phosphor powder was uniformly sealed at a constant mass fraction with respect to a transparent resin, was prepared, the sample was irradiated with excitation light of 455 nm in an integrating sphere LMS-200 (manufactured by Labsphare), and a converted light spectral radiant flux was measured by using a spectrometer Solid Lambda (manufactured by Spectra Co-op). The internal quantum efficiency was calculated from the converted light spectral radiant flux and an excitation light spectral radiant flux that was measured in advance.

[Method of Measuring Total Number of Crystal Grain Boundary Triple Points (A)/Number of Phosphor Particles (B)]

Measurement was performed by using Ultra 55 (manufactured by Carl Zeiss Co., Ltd.) as a scanning electron microscope, and a backscattered-electron detector Centaurus (manufactured by Carl Zeiss Co., Ltd.) as a detector. A visual range was set so that the number of phosphor particles (secondary particles) (B) became 50 or greater. Furthermore, the total number of the crystal grain boundary triple points (A) and the number of the phosphor particles (B) were counted by using image processing software ImageJ for contrast measurement.

Setting was made to a contrast for segmentation of the crystal grain boundary triple points and the phosphor particles, and conversion was made to an image in which the crystal grain boundary triple points were shown as a spot shape. Then, the number of spots was obtained through automatic counting with the same software. With regard to the number of the phosphor particles, the image, which was used to measure the crystal grain boundary triple points, was subjected to white-to-black inversion, and automatic counting was performed in the same manner. From results which were obtained, a number ratio was calculated.

[Method of Measuring Roundness]

A value of roundness was obtained from the image from which the value of the total number of the crystal grain boundary triple points (A)/the number of the secondary particles (B) was calculated through counting of the total number of the crystal grain boundary triple points (A) and the number of the secondary particles (B). Measurement was performed by using the image processing software ImageJ.

<Preparation of Phosphor>

Example 1

0.9441 g of $Sr_3N_2$, 0.0656 g of $Ca_3N_2$, 0.0163 g of $EuF_3$, 0.4567 g of AlN, and 0.5210 g of $Si_3N_4$ were respectively weighed in a nitrogen glove box so that a preparation composition of respective raw materials of the phosphor became $Sr_{0.874}Ca_{0.119}Eu_{0.007}AlSiN_3$. After sufficiently performing stirring and mixing, the resultant mixture was closely packed in a molybdenum crucible. The crucible was put in a temperature controller-attached resistive heating type electric furnace, and temperature raising and heating were performed to 1550° C. at a rate of 20° C./minute at a gauge pressure of 0.85 MPa in an Sr vapor-containing nitrogen atmosphere. Then, retention was performed for 48 hours, and radiation cooling was performed to room temperature. After performing pulverization with a mortar and sieving, a phosphor (1) was obtained.

Results, which were obtained by performing ICP emission spectral analysis and analysis with an oxygen-nitrogen analyzer (manufactured by LECO Cooperation) with respect to the phosphor that was obtained, are shown in Table 1. In addition, results, which were obtained by performing measurement of the total number of the crystal grain boundary triple points (A) and the number of the phosphor particles (B), measurement of roundness, measurement of chromaticity, and measurement of the internal quantum efficiency with respect to the phosphor that was obtained, are shown in Table 3.

Example 2

Respective metals were weighed so that a metal element composition ratio became Al:Si=1:1 (molar ratio), and the resultant raw material metal was melted in an argon atmosphere by using a graphite crucible and a high-frequency induction type melting furnace. Then, the resultant molten metal was poured from the crucible into a mold, and was solidified, thereby obtaining an alloy (parent alloy) in which the metal element composition ratio was Al:Si=1:1 (molar ratio).

The parent alloy and other raw material metals were weighed so that a metal element composition ratio became Eu:Sr:Ca:Al:Si=0.006:0.890:0.104:1:1 (molar ratio). After the inside of the furnace was evacuated up to $5 \times 10^{-2}$ Pa, evacuation was stopped, and the furnace was filled with argon up to a predetermined pressure. The parent alloy in a calcia crucible was melted in the furnace, and then Sr, Eu, and Ca were added to the resultant molten alloy. After confirming that the molten metal of which the entire components were melted was stirred with an induced current, the molten metal was poured from the crucible into a copper mold (plate shape having a thickness of 40 mm) that was cooled with water, and was solidified.

An alloy that was obtained showed a powder X-ray diffraction pattern that was similar to that of $Sr(Si_{0.5}Al_{0.5})_2$, and was identified as an intermetallic compound called an $AlB_2$-type alkaline-earth silicide. A combination powder, which was obtained by mixing 1.37 g of $Eu_2O_3$ to 160 g of alloy powder obtained by pulverizing the resultant plate-shaped alloy ingot to have a mass median diameter of 10.0 µm in a nitrogen stream, was filled in a boron tray, and the tray was set in a hot isotropic pressing device (HIP device).

After the inside of the device was evacuated up to $5 \times 10^{-1}$ Pa, heating was performed at 300° C., and evacuation was performed at 300° C. for 1 hour. Then, an operation of filling nitrogen in the device up to 1 MPa, performing pressure discharge up to 0.1 MPa after cooling, and filling nitrogen up to 1 MPa was repeated two times. Nitrogen was filled up to 45 MPa before initiation of heating, temperature was raised up to a sample temperature 1650° C. at a rate of 600°/hour, an inner pressure was raised up to 85 MPa at an average rate of 45 MPa/hour, and retention was performed for 4 hours. Then, heating was performed up to 1950° C. while raising the inner pressure of the device up to 100 MPa, and retention was performed at this temperature for 2 hours, thereby obtaining a phosphor having a preparation composition was $Sr_{0.88}Ca_{0.11}AlSiN_3$:$Eu_{0.013}$.

A result, which was obtained by performing ICP emission spectral analysis with respect to the phosphor that was obtained, is shown in Table 2. In addition, results, which were obtained by performing measurement of the total number of the crystal grain boundary triple points (A) and the number of the phosphor particles (B), measurement of roundness, measurement of chromaticity, and measurement of the internal quantum efficiency with respect to the phosphor that was obtained, are shown in Table 3.

Comparative Example 1

A comparative phosphor (1) was obtained by the same method as in Example 1 of JP-A-2007-291352.

In addition, results, which were obtained by performing measurement of the total number of the crystal grain boundary triple points (A) and the number of the phosphor particles (B), measurement of chromaticity, and measurement of the internal quantum efficiency with respect to the phosphor that was obtained, are shown in Table 3.

TABLE 1

|  |  | Eu | Sr | Ca | Al | Si | N | O |
|---|---|---|---|---|---|---|---|---|
| Example 1 | Composition ratio | 0.007 | 0.868 | 0.125 | 1.065 | 1.067 | 2.949 | 0.112 |
|  | % by mass | 0.58 | 40.6 | 2.68 | 15.3 | 16 | 22.2 | 1 |

TABLE 2

|  | Element analysis result (mol %) | | | | |
|---|---|---|---|---|---|
|  | Sr | Ca | Al | Si | Eu |
| Example 2 | 0.88 | 0.11 | 1.05 | 1.12 | 0.01 |

TABLE 3

|  | (A) | (B) | (A)/(B) | Round-ness | CIE x | CIE y | Internal quantum efficiency |
|---|---|---|---|---|---|---|---|
| Example 1 | 117 | 241 | 0.49 | 0.61 | 0.612 | 0.387 | 0.912 |
| Example 2 | 169 | 245 | 0.69 | 0.63 | 0.623 | 0.379 | 0.913 |
| Comparative Example 1 | 139 | 81 | 1.72 | — | 0.623 | 0.378 | 0.856 |

As shown in Table 3, it can be seen that the SCASN phosphor of the invention has high internal quantum efficiency.

While the present invention has been described in detail through certain embodiments, it will be understood by a skilled person that various changes and modifications may be made thereto within the spirit and scope of the invention. This application is based on Japanese patent application No. 2014-161721 filed Aug. 7, 2004, the entire content of which is hereby incorporated by reference.

The invention claimed is:

1. A phosphor represented by the following Formula [1], wherein the phosphor comprises phosphor particles in which single crystallites are three-dimensionally coupled to each other, the phosphor particles include a crystal grain boundary triple point, and

[a total number of the crystal grain boundary triple points (A)]/[the number of the phosphor particles (B)] is 1.0 or less, $$M_a Sr_b Ca_c Al_d Si_e N_f \quad [1]$$

(In Formula [1],

M represents an activation element, and a, b, c, d, e, and f represent values in the following ranges:

$0 < a \le 0.15$
$0.5 \le b < 1$
$0 < c < 0.5$
$a + b + c = 1$
$0.7 \le d \le 1.3$
$0.7 \le e \le 1.3$
$2.5 \le f \le 3.5$).

2. The phosphor according to claim 1, further comprising oxygen.

3. The phosphor according to claim 1, having a roundness of 0.6 or greater.

4. A light-emitting device, comprising:

a first light-emitting body; and a second light-emitting body that emits visible light through irradiation with light from the first light-emitting body, wherein the second light-emitting body contains one or more kinds of the phosphors according to claim 1 as a first phosphor.

5. An image display device, comprising the light-emitting device according to claim 4 as a light source.

6. An illumination device, comprising the light-emitting device according to claim 4 as a light source.

\* \* \* \* \*